US009851612B2

(12) United States Patent
Davis et al.

(10) Patent No.: US 9,851,612 B2
(45) Date of Patent: Dec. 26, 2017

(54) LIQUID CRYSTAL DISPLAY WITH IDENTIFIERS

(71) Applicant: Kent Displays Incorporated, Kent, OH (US)

(72) Inventors: Don Davis, Conneaut Lake, PA (US); Forrest Nicholson, Kent, OH (US)

(73) Assignee: Kent Displays Inc., Kent, OH (US)

( * ) Notice: Subject to any disclaimer, the term of this patent is extended or adjusted under 35 U.S.C. 154(b) by 144 days.

(21) Appl. No.: 14/243,432

(22) Filed: Apr. 2, 2014

(65) Prior Publication Data

US 2015/0286085 A1  Oct. 8, 2015

(51) Int. Cl.
  *G02F 1/1333* (2006.01)
  *G02F 1/137* (2006.01)
  *G02F 1/1334* (2006.01)
  *G06F 3/041* (2006.01)

(52) U.S. Cl.
  CPC ...... *G02F 1/13718* (2013.01); *G02F 1/13338* (2013.01); *G06F 3/0412* (2013.01); *G02F 1/1334* (2013.01); *G02F 2001/133374* (2013.01); *H01L 2223/544* (2013.01)

(58) Field of Classification Search
  CPC ............. G02F 1/13718; G02F 1/13338; G02F 1/1334; G02F 1/133509; G02F 1/133553; G02F 1/133516; G02F 2001/133374; G02F 2001/133543; G02F 2001/13478; G02F 2201/343; G06F 1/1613; G06F 3/0412; G09G 2380/04; G02B 3/208; G02B 3/22; G02B 3/223; Y10T 428/1041; H01L 2223/544; H01L 2223/54406; H01L 2223/54413; H01L 2223/5442; H01L 2223/54433; H01L 23/544; H01L 2223/554; G03F 9/7073; G03F 9/708; G03F 9/7084
  USPC ...... 349/12, 185, 104; 359/3, 350, 356, 361, 359/436; 428/1.3, 1.31, 187, 321.3, 327, 428/308.4
  See application file for complete search history.

(56) References Cited

U.S. PATENT DOCUMENTS

| 4,525,032 A | 6/1985 | Hilsum |
| 4,685,771 A | 8/1987 | West et al. |
| 5,347,811 A | 9/1994 | Hasegawa et al. |

(Continued)

FOREIGN PATENT DOCUMENTS

| JP | 05053537 | 3/1993 |
| JP | 08035759 | 2/1996 |

(Continued)

OTHER PUBLICATIONS

Amorphous Silicon Thin-Film Transistor Active-Matric Reflective Cholesteric Liquid Crystal Display: pp. 979-982 (1998).

(Continued)

*Primary Examiner* — Angela Davison
(74) *Attorney, Agent, or Firm* — Abel Law Group, LLP (57) ABSTRACT

A liquid crystal display with an identifier such as a watermark, serial number, logo or other graphic design, is disclosed. The identifiers can be read electronically or with the human eye. Methods are described for fabricating identifiers on cholesteric writing tablets in particular, with varying shades of gray and hence different degrees of visibility. The identifiers are permanent and not erased when a liquid crystal image on the display is erased.

18 Claims, 7 Drawing Sheets

(56) References Cited

U.S. PATENT DOCUMENTS

| | | | |
|---|---|---|---|
| 5,453,863 A | 9/1995 | West et al. |
| 5,493,430 A | 2/1996 | Lu et al. |
| 5,594,562 A | 1/1997 | Sato et al. |
| 5,644,330 A | 7/1997 | Catchpole et al. |
| 5,691,975 A | 11/1997 | Doane et al. |
| 5,748,277 A | 5/1998 | Huang et al. |
| 5,847,798 A | 12/1998 | Yang et al. |
| 5,920,364 A | 7/1999 | Akins et al. |
| 5,933,203 A | 8/1999 | Wu et al. |
| 6,104,448 A | 8/2000 | Doane et al. |
| 6,133,895 A | 10/2000 | Huang |
| 6,154,190 A | 11/2000 | Yang et al. |
| 6,204,908 B1* | 3/2001 | Hashimoto | C09K 19/544 349/112 |
| 6,268,839 B1 | 7/2001 | Yang |
| 6,359,673 B1 | 3/2002 | Stephenson |
| 6,377,321 B1 | 4/2002 | Khan et al. |
| 6,473,072 B1 | 10/2002 | Comiskey et al. |
| 6,504,588 B1* | 1/2003 | Kaneko | G02F 1/13363 349/104 |
| 6,639,578 B1 | 10/2003 | Comiskey et al. |
| 6,654,080 B1 | 11/2003 | Khan et al. |
| 6,697,039 B1 | 2/2004 | Yamakawa et al. |
| 6,727,873 B2 | 4/2004 | Gordon, II et al. |
| 6,730,862 B1 | 5/2004 | Gasparik |
| 6,752,430 B2 | 6/2004 | Holt et al. |
| 6,753,933 B2 | 6/2004 | Cirkel et al. |
| 6,759,399 B1 | 7/2004 | Petit et al. |
| 6,788,362 B2* | 9/2004 | Stephenson | G02F 1/1334 349/86 |
| 6,788,363 B2 | 9/2004 | Liu et al. |
| 6,811,815 B2 | 11/2004 | He et al. |
| 6,816,138 B2 | 11/2004 | Huang et al. |
| 6,825,829 B1 | 11/2004 | Albert et al. |
| 6,833,885 B2 | 12/2004 | Hisamitsu et al. |
| 6,842,210 B2 | 1/2005 | Hashimoto et al. |
| 6,934,792 B1 | 8/2005 | Nakazawa |
| 6,999,061 B2 | 2/2006 | Hara et al. |
| 7,061,559 B2 | 6/2006 | Khan et al. |
| 7,075,593 B2 | 7/2006 | Vidal et al. |
| 7,132,064 B2 | 11/2006 | Li et al. |
| 7,136,048 B2 | 11/2006 | Yrjanainen et al. |
| 7,170,481 B2 | 1/2007 | Doane et al. |
| 7,188,996 B2 | 3/2007 | Parker |
| 7,190,337 B2 | 3/2007 | Miller, IV et al. |
| 7,236,151 B2 | 6/2007 | Doane et al. |
| 7,242,394 B2 | 7/2007 | Lahade et al. |
| 7,245,483 B2 | 7/2007 | Feague et al. |
| 7,317,437 B2 | 1/2008 | Huang et al. |
| 7,351,506 B2 | 4/2008 | Schneider et al. |
| 7,385,656 B2 | 6/2008 | Nose et al. |
| 7,479,940 B2 | 1/2009 | Marhefka |
| 7,746,430 B2 | 6/2010 | Kurosaki et al. |
| 8,009,263 B2* | 8/2011 | Mi | B44F 1/10 349/175 |
| 8,139,039 B2 | 3/2012 | Schneider et al. |
| 8,199,086 B2 | 6/2012 | Doane |
| 8,228,301 B2* | 7/2012 | Schneider | G06F 3/0412 345/104 |
| 8,229,301 B2 | 7/2012 | Hahin et al. |
| 8,310,630 B2* | 11/2012 | Marhefka | G02F 1/1347 349/115 |
| 2002/0022113 A1 | 2/2002 | Kimura |
| 2003/0058227 A1 | 3/2003 | Hara et al. |
| 2003/0071754 A1 | 4/2003 | McEwan |
| 2003/0137496 A1 | 7/2003 | Stevens et al. |
| 2003/0156099 A1 | 8/2003 | Yrjanainen et al. |
| 2003/0156243 A1 | 8/2003 | Yoshihara et al. |
| 2003/0160741 A1 | 8/2003 | Martinez |
| 2004/0066374 A1 | 4/2004 | Holloway et al. |
| 2004/0140964 A1 | 7/2004 | Wang et al. |
| 2004/0145691 A1 | 7/2004 | Kubota et al. |
| 2004/0159702 A1 | 8/2004 | Rosenfeld |
| 2004/0207606 A1 | 10/2004 | Atwood et al. |
| 2004/0263486 A1 | 12/2004 | Seni |
| 2005/0079386 A1 | 4/2005 | Brown, Jr. et al. |
| 2005/0104806 A1 | 5/2005 | Stephenson, III |
| 2006/0017708 A1 | 1/2006 | Fukui et al. |
| 2006/0151601 A1 | 7/2006 | Rosenfeld |
| 2006/0204675 A1 | 9/2006 | Gao et al. |
| 2006/0262235 A1 | 11/2006 | Vogels et al. |
| 2006/0267955 A1 | 11/2006 | Hino |
| 2007/0026163 A1 | 2/2007 | Schneider et al. |
| 2007/0059901 A1 | 3/2007 | Majumdar et al. |
| 2007/0063939 A1 | 3/2007 | Bellamy |
| 2007/0085837 A1 | 4/2007 | Ricks et al. |
| 2007/0126674 A1 | 6/2007 | Doane |
| 2007/0152928 A1 | 7/2007 | Doane et al. |
| 2007/0164980 A1 | 7/2007 | Manning |
| 2007/0237906 A1 | 10/2007 | Li et al. |
| 2007/0238080 A1 | 10/2007 | Lynch |
| 2007/0277659 A1 | 12/2007 | Schneider et al. |
| 2007/0285385 A1 | 12/2007 | Albert et al. |
| 2008/0074383 A1 | 3/2008 | Dean |
| 2008/0151152 A1 | 6/2008 | Yang et al. |
| 2008/0309598 A1 | 12/2008 | Doane et al. |
| 2009/0033811 A1 | 2/2009 | Schneider |
| 2009/0096942 A1 | 4/2009 | Schneider et al. |
| 2009/0284691 A1 | 11/2009 | Marhefka |
| 2009/0297860 A1 | 12/2009 | Sasuki et al. |
| 2010/0216635 A1 | 8/2010 | Kazmaier et al. |
| 2010/0245221 A1 | 9/2010 | Khan |
| 2011/0187650 A1 | 8/2011 | Lee |
| 2011/0193874 A1 | 8/2011 | Jung et al. |
| 2012/0099030 A1 | 4/2012 | Pishnyak |
| 2012/0120350 A1 | 5/2012 | Ma |
| 2013/0021549 A1* | 1/2013 | Fujita | G02F 1/133617 349/41 |
| 2013/0286315 A1* | 10/2013 | Yanagisawa | G02F 1/136209 349/44 |
| 2013/0314622 A1 | 11/2013 | Braganza et al. |
| 2014/0043547 A1 | 2/2014 | Marhefka |

FOREIGN PATENT DOCUMENTS

| | | |
|---|---|---|
| JP | 2001125108 | 5/2001 |
| JP | 2001334693 | 12/2001 |
| JP | 2002163070 | 6/2002 |
| JP | 2004331697 | 11/2004 |
| WO | 2005081779 | 9/2005 |
| WO | 2009065563 | 5/2009 |

OTHER PUBLICATIONS

Flexible Electronic Skin Display, SID Intl. Symp. Disgest Tech., 40 16 (2009) by E. Montbach et al.
J.William Doane and Asad Khan, Cholesteric Liquid Crystals for Flexible Displays, Flexible Flat Panel Displays, 331-354, 2005, John Wiley & Sons, Ltd.
Dry Erase Presentation Boards, Retrieved from http://speakeasydryerase.com/files/specifications/selfadhesivespec.pdf Feb. 19, 2009.
T. Schneider, et al., Flexible Encapsulated Cholesteric LCDs by Polymerization Induced Phase Separation, SID International Symposium Digest of Technical Papers, 2005, vol. 36, p. 1568.
Motion Display Fixed Overlay product, retrieved from http://www.motiondisplay.com/products/fixed_overlay.html#0 prior to Mar. 26, 2013.
Motion Display Technology—How it Works—retrieved from http://www.motiondisplay.com/technology/#2 prior to Mar. 26, 2013.
Brochure of a Skin Flik™ electronic skin product published in the U.S. after May 22, 2011.
Description of a Skin Flik™ electronic skin product sold in the U.S. after May 22, 2011.
E. Montbach, et al., Flexible Electronic Skin Display, SID Symposium Digest of Technical Papers, 2009, vol. 40, p. 16.
Etch a Sketch Animator 2000, Retrieved from http://en.wikipedia.org/wiki/Etch_A_Sketch Feb. 19, 2009.
Final Office action dated Jan. 19, 2012 from U.S. Appl. No. 11/762,174, filed Jun. 13, 2007.

(56) References Cited

OTHER PUBLICATIONS

How Magna Doodle Works, Retrieved from http://entertainment.howstuffworks.com/magna-doodle.htm Feb. 19, 2009.
Interactive Whiteboard, Retrieved from http://www.alibaba.com/product-gs/212710367/Interactive_Whiteboard.html Feb. 19, 2009.
International Search Report for Application No. PCT/US2010/036175 dated Dec. 23, 2010.
Notice of Allowance dated Feb. 16, 2012 from U.S. Appl. No. 12/217,158, filed Jul. 1, 2008.
Office action dated Jun. 24, 2011 from U.S. Appl. No. 11/762,174, filed Jun. 13, 2007.
Smartboard Polycom IVC, Retrieved from http://d1.austincc.edu/ivc/equipment/smartboardh323.htm.
T. Schneider, et al., A Flexible Touch-Sensitive Writing Table, SID International Symposium Digest of Technical Papers, 2008, vol. 39, p. 1840.
Office Action dated Jul. 17, 2014 for U.S. Appl. No. 13/477,602.
Office Action dated Jul. 31, 2014 for U.S. Appl. No. 13/477,638.
Office Action dated Oct. 15, 2012 for U.S. Appl. No. 12/729,678.
Final Rejection dated Jun. 5, 2013 for U.S. Appl. No. 12/729,678.
U.S. Appl. No. 13/477,638 dated May 22, 2012.
U.S. Appl. No. 13/477,602 dated May 22, 2012.
U.S. Appl. No. 14/069,901 dated Nov. 1, 2013.
U.S. Appl. No. 13/754,481 dated Jan. 30, 2013.
U.S. Appl. No. 13/927,647 dated Jun. 26, 2013.
U.S. Appl. No. 13/965,255 dated Aug. 13, 2013.
U.S. Appl. No. 13/975,692 dated Aug. 26, 2013.

\* cited by examiner

LIQUID CRYSTAL DISPLAY WITH IDENTIFIERS

TECHNICAL FIELD

This disclosure pertains to the field of liquid crystal displays and their fabrication, as well as forming permanent identifiers on the displays.

TECHNICAL BACKGROUND

Recently, the pressure sensitive cholesteric liquid crystal (ChLC) writing tablet, Improv Electronics® Boogie Board® LCD eWriter, has appeared on the market in which a pointed stylus or the finger can be used to write or trace an image on the surface of the tablet as described in U.S. Pat. No. 6,104,448, which is incorporated herein by reference in its entirety. Improv Electronics® is a unit of Kent Displays, Inc. Such a stylus does not transfer any ink or other material to any surface. This tablet offers a considerable improvement over previous tablet technologies in that the image can be simply and instantly erased with the push of a button that applies a voltage pulse to electrodes in the tablet. In a ChLC tablet, the liquid crystal is commonly dispersed in a polymer network and sandwiched between two substrates that are spaced to a particular gap. The upper substrate is flexible and the bottom substrate is painted with a light absorbing (black or colored) background. The cell gap is usually set by plastic or glass spacers that are either cylindrical or spherical in shape. When one presses on the top substrate with a pointed stylus, fingernail or other object, the liquid crystal is locally displaced. Flow induced in the liquid crystal changes its optical texture from a substantially transparent to a brilliant reflective color at the location of the pressure. The reflective lighter color contrasts well to the dark background of the lower substrate. An image traced by the stylus or finger will remain on the tablet indefinitely until erased, typically consuming no power. Erasure is accomplished by applying a voltage pulse to substantially transparent conducting electrodes on the inner surface of the substrates that drive the ChLC from its color reflective state back to its substantially transparent state.

The above referenced technology and its applications are disclosed in more detail in U.S. Pat. No. 6,104,448, which is incorporated herein by reference in its entirety. Polymer dispersions of the cholesteric liquid crystal can be used to control the pressure sensitivity as described in U.S. Pat. No. 8,228,301, which is incorporated herein by reference in its entirety. Other modes of operation, including multiple color images, negative images and select erase, are described in the patent given immediately above as well as in U.S. Pat. No. 8,139,039, which is incorporated herein by reference in its entirety. Likewise, a variety of different versions of ChLC writing tablet have been developed where the background on the lower substrate is made semitransparent to allow for the use of templates, U.S. patent application Ser. No. 13/477,638, which is incorporated herein by reference in its entirety. Another version of a ChLC writing tablet, has patterned background or foreground markings, U.S. patent application Ser. No. 13/477,602, which is incorporated herein by reference in its entirety, to provide for a variety of different effects.

In order to provide image digitization, a touchscreen or dot pattern can be incorporated on the device such as disclosed in published U.S. Patent Application Pub. No. 2014-0043547 and U.S. patent application Ser. No. 14/069,901, which both are incorporated herein by reference in their entireties. Pressure from a stylus applied on the top substrate induces local shear driving the cholesteric liquid crystal from a dark state to a bright configuration in the stressed region. The drawing is simultaneously digitized and recorded. Therefore, an image is captured as a digital image in a storage unit to be later recalled on a computer or mobile device screen.

A disadvantage of this design is that eWriters produced in a standard fashion do not possess unique identifiers in the actual device, such as serial numbers, unique graphic designs or "watermark" (e.g., "digital watermark") identifiers of interest to customers for logistics and security purposes. An approach is needed to provide an efficient and effective method in the production of the eWriter to create patterns on the eWriter that provide a visual effect similar to watermarks on paper. The disclosure herein describes a process of creating images with various degrees of visibility or shades of gray on a liquid crystal display (e.g., an eWriter display) that is subtle enough not to detract from a hand written image over it, yet distinctive enough to read.

TECHNICAL SUMMARY

We are accustomed to watermarks on paper which are a recognizable image or pattern that can appear in various shades of gray (lightness to darkness) when viewed by diffuse reflected light. On paper, watermarks are made by thickness or density variations in the paper fibers. They are used, for example, on stationery as identifiers as well as on currency and postage stamps for security. Watermark processes allow for a wide variation in visibility or shades of gray to control their visibility. Some may be obvious on casual inspection while others may be more difficult to pick out. Watermarks have been found to be useful for paper because they can be used for dating, identifying sizes and determining the quality of a sheet of paper.

We disclose a method for providing an "identifier," as defined in this disclosure below, on a liquid crystal display (e.g., an eWriter such as the Boogie Board® writing tablet by Kent Displays, Inc.) having the features of a watermark. The term "identifier" as used in this disclosure means a permanent reflective image formed on a liquid crystal display and differs from the conventional term watermark in that water or paper are not used. Like those on paper, the identifiers on an eWriter can be subtle, hidden or covert, meaning that they may not be readily visible to the naked eye but are highly visible to a specially designed imaging device (e.g., camera). This innovation for providing gray scale identifiers on liquid crystal displays (e.g., eWriters) is also suitable for logos, a graphic design or emblem, used by companies, organizations or individuals to aid and promote instant public recognition. Another, and perhaps most useful application of an identifier for electronic tablets, is its use as a serial number. A serial number is a unique code assigned to a single unit for identification. Although usually a number, it may consist of a combination of letters and digits. Typically serial numbers of a production run are incremented or changed from one unit to the next. Units may be marked with several different codes, but only one of these will be a serial number while others may identify the part, specify installed options, or other features. The identifiers applied on the liquid crystal display in this disclosure can also form a digital watermark. Another possibility is for the indicia to form a bar code.

A specific disclosed device is an eWriter, a cholesteric liquid crystal (ChLC) writing tablet, with an embedded identifier. The eWriter functions normally with the identifier, and images drawn on the surface of the eWriter appear "over" or "under" the identifier, depending on whether the identifier is formed above or below the liquid crystal layer. When the written image on the writing tablet is erased, the identifier remains unaffected by the eWriter's erase feature. Possible use of this includes a product serialization, incorporation of graphic designs, and producing a watermark for logistics, security, and branding and/or custom designs for cosmetic purposes.

In a particular embodiment, the disclosed method describes the process of thinning or etching the back light absorbing film coating on the back display substrate using a laser. A laser is used to partially or completely ablate the ink or coating in the desired pattern which could be a line drawing, a geometric design, alpha-numeric text, or combination of these in various scales/levels of gray to allow for different degrees of visibility. The laser power and scanning speed is adjusted so that just the ink is suitably ablated and damage to the substrate is minimized. The laser power and scanning speed can be further adjusted individually or in combination to ablate only part of the back ink layer thus allowing the generation of gray scale images. This process can be performed in line on the film only during eWriter manufacturing or off line (post production) on the completed eWriter display. A second ink could be printed over the first ink which would fill in the opening made by the laser to create two or more color patterns as seen from the viewing side. This laser ablation approach could be extended to other display types including eSkins, glass ChLCD's, etc. The liquid crystal display that can be made or modified to include an identifier as disclosed herein may be a display of an electronic device selected from the group consisting of: a cell phone, a smart phone, a writing tablet (eWriter), a laptop, a radio, a desktop monitor, an mp3 player, an eReader (for reading electronic books), a toy, a television, motor vehicle accessory, an electronic skin, and combinations thereof. Furthermore, this approach may also use laser ablation to make dot pattern identifiers on an eWriter used for a dot pattern recognition system whereby a special pen with an optical camera can locate the instantaneous position of the pen necessary for digitally recording the image such as for example in U.S. patent application Ser. No. 14/069,901, which is incorporated herein by reference in its entirety.

In another embodiment, eWriter and other display identifiers may be achieved by partial laser ablation of the upper display substrate of the display or by ablation of the hard coat or other transparent coating on a display substrate.

It should also be appreciated that the light absorbing back layer can be formed on a back substrate, or it can be an independent layer with or without a back substrate, and can be used with removable patterns below it, as in the case when a removable pattern is used in the semitransparent display device (having a partially light absorbing back layer).

It can further be appreciated that the identifier can be formed by other techniques such as mechanical etching or abrasion, waterjet, air, vibration, chemical etching, hot stamping, or other means.

A first aspect of this disclosure generally features a liquid crystal display including the following features. There is an upper substrate. There is a liquid crystal layer including liquid crystal material near the upper substrate. Electrically conductive layers are disposed on either side of the liquid crystal layer. A light absorbing back layer is positioned so as to absorb light passing through the liquid crystal layer. An image is formed by changing the reflective state of the liquid crystal, which contrasts with the light absorbing back layer. An identifier is formed on a component of the display selected from the group consisting of: the upper substrate, a layer disposed on or near the upper substrate, the light absorbing back layer and combinations thereof.

It will be apparent to those skilled in the art that reference to a light absorbing back layer means completely absorbing all wavelengths of light or partially absorbing certain wavelengths of light (e.g., so as to be semitransparent).

Referring to specific features of the first aspect, the display can include electronic circuitry that is in electrical contact with the electrically conductive layers and applies a voltage that erases the image. In yet another feature the upper substrate is transparent and the identifier is formed by etching the substrate. The identifier can be selected from the group consisting of: a watermark; a digital watermark, a graphic design; a bar code, an identification numeral, an identification code, a dot pattern and combinations thereof.

As another feature, the identifier can be formed by etching the light absorbing back layer so as to produce a gray scale image on the display that is not erased by the electronic circuitry. The etched light absorbing back layer can include recessed spots, lines, or regions formed therein that form the identifier, comprising a coating in the recessed lines, spots, or regions of the light absorbing back layer. The coating can reflect infrared light with a different reflectivity than the light absorbing back layer and enable the identifier to be hidden except when viewing with an imaging device that views infrared light. Another feature is that the coating can be selected to reflect light of a predetermined color. In yet another feature, the coating can contain a fluorescent dye that emits visible light when activated by ultraviolet light enabling the identifier to be hidden except when the display is irradiated by ultraviolet light.

In another feature the display includes a lower transparent substrate disposed below the liquid crystal layer; the light absorbing back layer includes a semitransparent ink disposed on the lower transparent substrate.

Another feature is that the display is a passive or active matrix display including patterned electrically conductive layers and electronic drive circuitry that is in electrical contact with the electrically conductive layers and applies a voltage that changes reflectivity of the liquid crystal so as to form an image on the display and erases an image on the display.

Yet another feature of the display includes at least two stacked liquid crystal layers each sandwiched between two electrically conductive layers. Each of the liquid crystal layers reflects light of a different color than the other liquid crystal layers (e.g., the stacked liquid crystal layers each reflecting one of red, green and blue). This display can be an eWriter, an electronic skin, a passive matrix display or an active matrix display. The passive matrix display can include patterned electrically conductive layers and electronic drive circuitry that is in electrical contact with the electrically conductive layers and applies a voltage that changes reflectivity of the liquid crystal so as to form an image on the display and erases an image on the display.

A second aspect of the disclosure features an electronic device including the liquid crystal display of the first aspect. The electronic device is selected from the group consisting of: a cell phone, a smart phone, a tablet, a laptop, a radio, a desktop monitor, an mp3 player, an eReader (e.g., for reading electronic books), an eWriter, an electronic skin, a toy, a television, motor vehicle instrument or accessory, and combinations thereof.

A third aspect of the disclosure features a writing tablet including the following features. There is flexible polymeric layer forming a writing surface. A liquid crystal layer includes cholesteric liquid crystal material dispersed in polymer that allows localized flow of the liquid crystal caused by writing pressure on the writing surface that forms an image by changing the cholesteric liquid crystal material to a reflective state or a substantially transparent state where the writing pressure is applied. Electrically conductive layers are disposed on each side of the liquid crystal layer. A light absorbing back layer absorbs light passing through the liquid crystal layer. Electronic circuitry applies a voltage to the electrically conductive layers. The voltage places the cholesteric liquid crystal material into one of the substantially transparent state or the reflective state so as to erase the image. An identifier is formed on a component of the display that is selected from the group consisting of: the flexible polymer layer, a layer disposed on or near the flexible polymer layer, the light absorbing back layer and combinations thereof.

Referring now to specific features of the third aspect, the identifier can be formed by etching the light absorbing back layer so as to produce a gray scale image on the writing tablet that is not erased by the electronic circuitry. The flexible polymer layer and the electrically conductive layers can be transparent and the identifier can be formed by etching the flexible polymer layer. The identifier can be selected from the group consisting of: a watermark; a digital watermark; a graphic design; a bar code, an identification numeral, an identification code, a dot pattern and combinations thereof.

Any of the specific features discussed above in connection with the previous aspects, or any specific features described in the following Detailed Description can be used in this third aspect in any combination.

A fourth aspect of the disclosure features an electronic device including the liquid crystal display of the third aspect. The electronic device is selected from the group consisting of: a cell phone, a smart phone, a tablet, a laptop, a radio, a desktop monitor, an mp3 player, an eReader (e.g., for reading electronic books), an eWriter, an electronic skin, a toy, a television, motor vehicle instrument or accessory, and combinations thereof.

A fifth aspect of this disclosure features a method of providing an identifier on a liquid crystal display including the following steps. An assembled liquid crystal display is provided including: an upper substrate; a liquid crystal layer including liquid crystal material near the upper substrate; electrically conductive layers disposed on either side of the liquid crystal layer; a light absorbing back layer (which may be opaque or semitransparent) positioned so as to absorb light passing through the liquid crystal layer; and wherein an image is formed on the display that contrasts with the light absorbing back layer. A permanent identifier is provided on a component of the assembled display selected from the group consisting of: the upper substrate, a layer disposed on or near the upper substrate, the light absorbing back layer and combinations thereof.

Referring to specific features of the fifth aspect, the permanent identifier can be formed using a process selected from the group consisting of mechanical etching or abrasion, waterjet, air, chemical etching, laser etching, hot stamping and combinations thereof. The identifier can be selected from the group consisting of: a watermark; a digital watermark; a graphic design; a bar code, an identification numeral, an identification code, a dot pattern and combinations thereof. In another feature the etching can form etched regions of different depth on the light absorbing back layer resulting in producing the identifier in gray scale.

Another specific feature of the fifth aspect is that the liquid crystal display is a writing tablet including a flexible polymeric upper substrate forming a writing surface. The liquid crystal layer includes cholesteric liquid crystal material dispersed in polymer that allows localized flow of the cholesteric liquid crystal caused by writing pressure on the writing surface that forms the image by changing the cholesteric liquid crystal material to a reflective state or a substantially transparent state where the writing pressure is applied. Electronic circuitry applies a voltage to the electrically conductive layers. The voltage places the cholesteric liquid crystal material into one of the substantially transparent state or the reflective state so as to erase the image.

Any of the specific features discussed above in connection with the previous aspects, or any specific features described in the following Detailed Description, can be used in this fifth aspect in any combination.

A sixth aspect of the disclosure features a method of providing an identifier on a component of a liquid crystal display during fabrication of the liquid crystal display including the following steps. Provided is at least one component of a liquid crystal display selected from the group consisting of: an upper substrate, an optional layer that can be disposed on or near the upper substrate, a light absorbing back layer (which may be opaque or semitransparent) and combinations thereof. A permanent identifier is formed on the component. The fabrication of the display is completed by incorporating the at least one component that includes the identifier, as part of the display.

Any of the specific features discussed above in connection with the previous aspects, or any specific features described in the following Detailed Description, can be used in this sixth aspect in any combination. For example, the liquid crystal display can be the writing tablet described above and in this disclosure.

Many additional features, advantages and a fuller understanding of the embodiments of the disclosure will be had from the accompanying drawings and the detailed description that follows. It should be understood that the above Technical Summary describes embodiments of the disclosure in broad terms while the following Detailed Description of Example Embodiments describes embodiments of the disclosure more narrowly and presents specific embodiments that should not be construed as necessary limitations of the invention as broadly defined in the claims.

BRIEF DESCRIPTION OF THE DRAWINGS

FIG. 1: Illustration of writing tablet display of the prior art, wherein FIG. 1a is a side view and FIG. 1b is a perspective view of the display.

FIG. 4: Illustration of laser ablated text on a writing tablet display, wherein FIG. 4a shows a numeric identifier while

DETAILED DESCRIPTION OF EXAMPLE EMBODIMENTS

Provided are embodiments of an electronic writing/drawing tablet that has one or more of the desired features discussed above.

Figures 1, 1B:
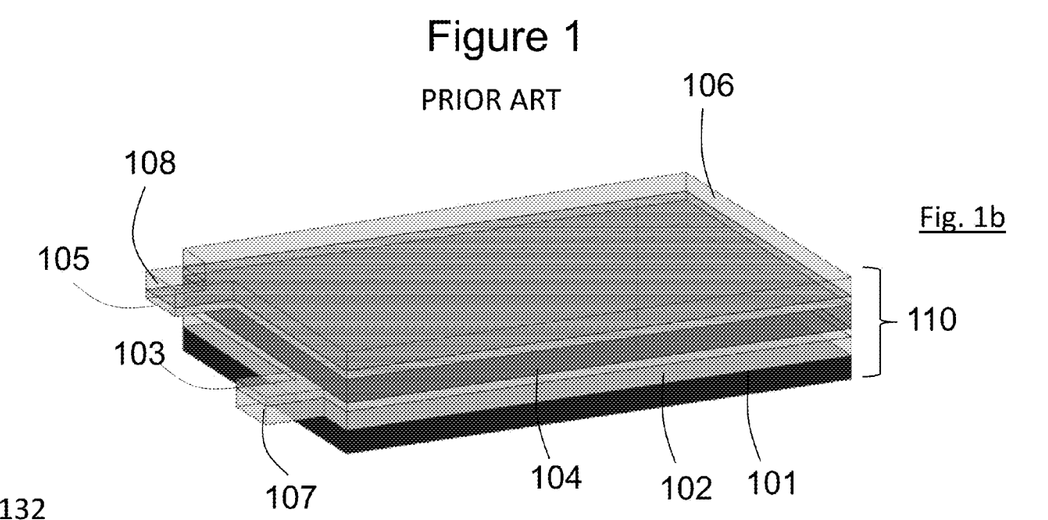
Figure 1A:
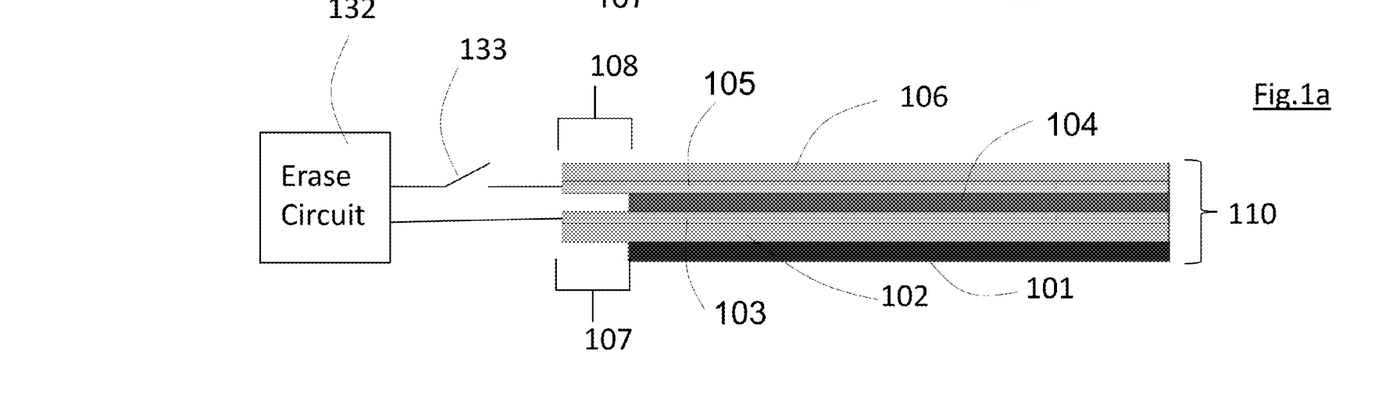

A cholesteric writing tablet display of the prior art is illustrated in FIG. 1 where FIG. 1a_shows a side view of the display including the attached electronic erase circuitry 132 and erase switch 133. A three dimensional view of the writing tablet display without the erase circuitry and switch attachment is illustrated in FIG. 1b. As described in U.S. Pat. Nos. 6,104,448, 8,228,301, and 8,139,039, the following basic components of the writing tablet display are: A flexible transparent upper substrate 106 that possesses an interconnecting ledge 108; a transparent conductor, usually a conducting polymer, 105 that coats the substrate and extends on to interconnecting ledge 108 serving to electrically connect the electrode to the eraser switch 133 as illustrated in FIG. 1a; a cholesteric liquid crystal material dispersed in a polymer network (or dispersion) 104; a transparent conductor, usually a conducting polymer, 103 that coats lower substrate 102 and extends on to interconnecting ledge 107 of substrate 102 which provides an electrical connection to the erase circuit 132 as illustrated in FIG. 1a; a dark opaque or semitransparent coating, usually a dark colored ink 101 as a separate layer or coating the lower substrate 102 which is, in particular, optically transparent. The interconnecting ledges 107 and 108 are shown here to be external but may be internal as described in U.S. patent application Ser. No. 13/754,481, which is incorporated herein by reference in its entirety. As described in U.S. Pat. No. 6,104,448, when one applies pressure by pressing on the top substrate 106 with a pointed stylus, fingernail or other object, the top substrate 106, being flexible, bends in the vicinity of the pointed object causing the liquid crystal in the dispersion 104 below it to be displaced. Flow induced in the liquid crystal changes its optical texture from a substantially transparent focal conic texture to a brilliant reflective color (planar texture) at the location of the pressure. The reflective lighter color contrasts well to the dark background coating 101 where the dark background can be opaque or semitransparent, absorbing only certain wavelengths of light as disclosed in U.S. patent application 2013/0314622, which is incorporated herein by reference in its entirety. An image traced by the stylus or finger will remain on the tablet indefinitely until erased, consuming no power. Erasure is accomplished by applying a voltage pulse to substantially transparent conducting (e.g., unpatterned and continuous) electrodes 105 and 107 on the inner surface of the substrates that drives the ChLC from its color reflective state back to its substantially transparent state. Other suitable modes of operation are disclosed in U.S. Pat. Nos. 8,228,301 and 8,139,039.

Figure 2:
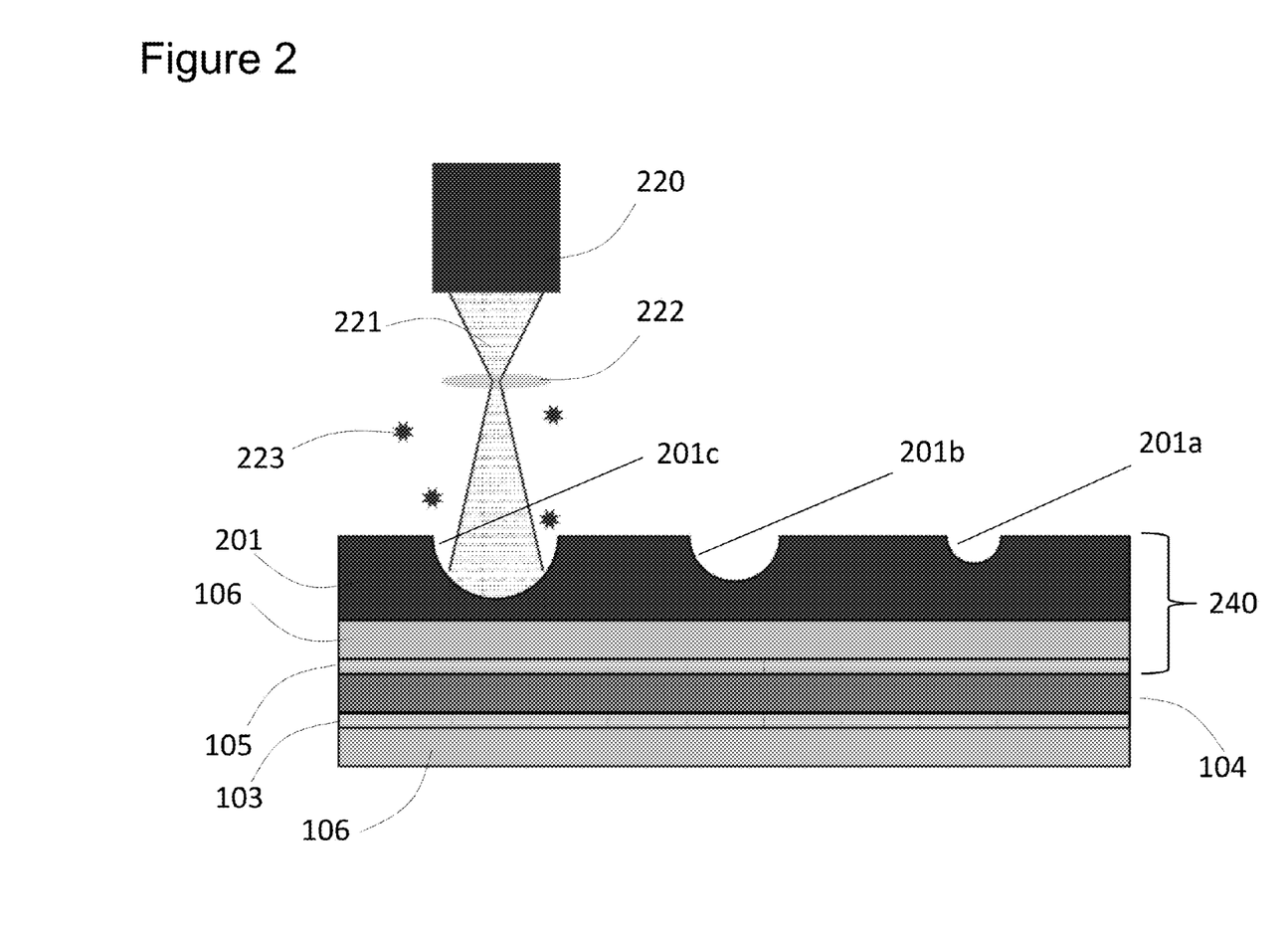
FIG. 2: Sketch of a laser ablation process of a back ink coated film.

In order to create a watermark or other identifier on the background ink, a method is used to etch the ink to create varying degrees of visibility or, using language of information display technology, varying levels of gray. In one embodiment the image of the identifier is created by etching the dark opaque coating on the back of the writing tablet display 101 of FIG. 1 (although this is not known from the prior art). This specific method of fabricating an identifier is illustrated in FIG. 2 where a laser is used to ablate the back coat of a writing tablet display. Laser ablation is believed to be especially advantageous when used during roll-to-roll fabrication of the liquid crystal displays in view of its very precise, programmable and rapid etching ability. FIG. 2 shows the components of a writing tablet display, without the interconnecting ledges and turned upside down so that the back coat 201 is facing upward exposing it to laser 220. Forming identifiers with other techniques besides a laser (e.g., mechanical etching, abrasion or vibration, waterjet, airjet, chemical etching, hot stamping, and combinations thereof) is also contemplated within the scope of the invention. The other components of the writing tablet 106, 105, 104, 103, and 106 are as described in FIG. 1.

The ablating process illustrated in FIG. 2 shows the beam 221 of the laser 220 being focused on to the back layer 201 by lens 222 with ablated particles 223 being scattered from the surface. The amount by which the surface is etched depends upon the intensity of the laser beam 221 and the etching time. The etching time can be governed by a speed at which the laser traces the identifier image. FIG. 2 shows examples of three levels of etching regions (e.g., lines or spots)—201a, 201b and 201c. Each of these levels of etching creates a different level of gray on the background of the writing tablet display with deepest etched region 201c creating the brightest image while the shallowest etched region 201c creates the least bright image. It should be understood that the image (identifier) created by etching is a permanent image and is not erased or modified by operation of the display. In contrast, the image created by the liquid crystal can be electronically or mechanically changed. That is, in the case of a writing tablet the image is mechanically traced on the display with the pressure of a pointed stylus and erased electronically, while in the case of a digital display the image is both created and erased electronically. In both the digital display and writing tablet the liquid crystal image is visible on top of the permanent etched image. The liquid crystal image can be erased using drive or erase electronics (e.g., as used in the Boogie Board® writing tablet), by using a piezoelectronic transducer as disclosed in U.S. applications Ser. Nos. 13/927,647 and 13/965,255, or by using induction, as disclosed in U.S. application Ser. No. 13/975,692, which applications are all incorporated herein by reference in their entireties.

The appearance of the permanent etched image or identifier; that is, its brightness, color or visibility, can be modified by an additional coating that may be applied over the back coat 201 after it has been etched. If the etching is sufficiently deep or complete, the color of the back coat will appear on the display. This can be advantageous in several ways: 1) It can be used to create a covert watermark that can only be seen under special lighting conditions such as for security purposes. For example, the added coating could be an ink that has different infrared reflectivity than the back coat ink. In this case, the etched identifier would only be visible to an infrared camera or viewing device. 2) Alternatively, the visibility of the identifier could be enhanced with ultraviolet, UV, light. In this case, the additional coating could be a fluorescent dye embedded in the over coating that was activated by ultraviolet. When activated the dye would become light emitting. In this way, the identifier would become visible or made to become brighter when the UV light was irradiated on the device. 3) The identifier could appear colored by over coating the etched back coat with ink of different color than the back coat. If the back coat was black and the added overcoat was a bright color such as red, yellow, or blue, the identifier was that same color when the liquid crystal was in the transparent state; however, when the liquid crystal was driven to its reflective color, say mechanically by a stylus, or electrically in the case of a digital display, the color of the identifier would change to a color that would be a mixture of the reflective color of the liquid crystal and the color of the additive over coat as explained in U.S. Pat. No. 6,377,321, which is incorporated herein by reference in its entirety. As an example, if the over coating was blue and the liquid crystal was reflective at the green wavelength, the identifier would appear white when the liquid crystal was in its reflective state. This feature might be particularly useful in the case of an electronic skin. Cases 1) and 2) might be useful on a writing table where identifiers were in the form of bar codes, identification numbers (e.g., serial numbers), digital watermarks and the like, that are "hidden" but readily viewed by the manufacturer with appropriate imaging devices. This will enable the manufacturer to again verify the authenticity of the device, while also obtaining relevant information provided by the identification numbers.

Figure 3:
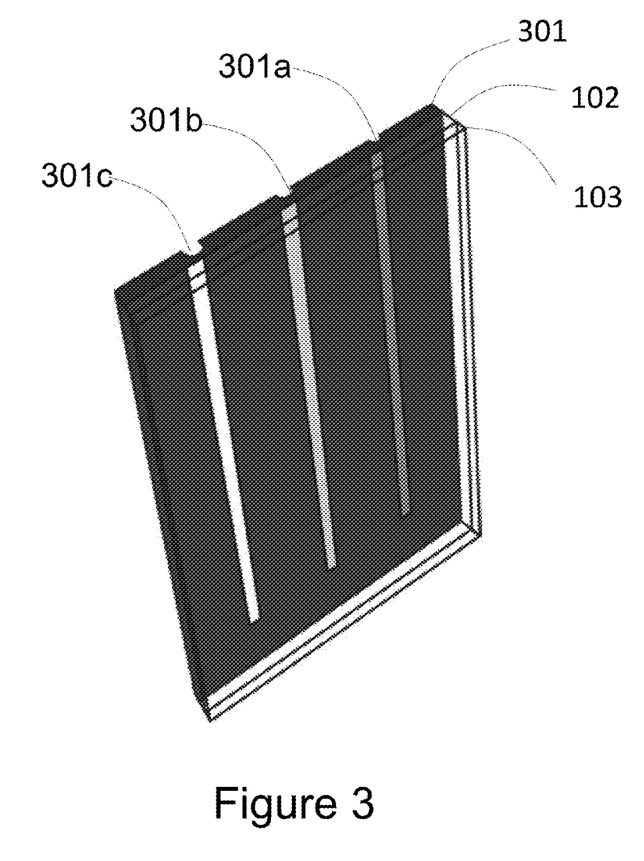
FIG. 3: Illustration of grayscale ablated in back ink on a substrate.

On a writing tablet manufacturing line it may not be desirable to etch the final or completed display product but to etch only the lower substrate with all or some of its coatings before the display is constructed such as components 240 of FIG. 2. This is illustrated in FIG. 3 showing a three dimensional view of the bottom substrate 102 with the conducting layer 103 and laser ablated lines 301a, 301b and 301c that have been etched in the back layer 301 in the manufacturing process before the final writing tablet display has been assembled. In such a manufacturing process a laser is scanned across either a stationary or moving back ink coated film 301 or display. Region 301c is etched the deepest (for example, slowest scanning speed) and hence forms the brightest image whereas region 301a is etched the most shallow (for example, faster scanning speed) and forms the least bright image; and region 301b is etched an intermediate amount to form a gray level in between the images produced by etched regions 301c and 301a. Likewise, the gray level or depth of etch could be controlled by adjustments in the laser intensity.

Figure 4A:
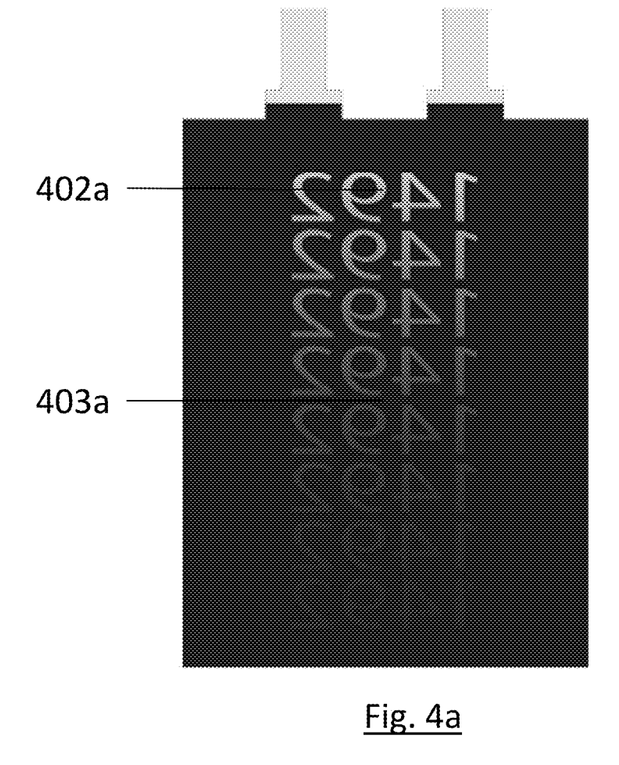
Figure 4B:
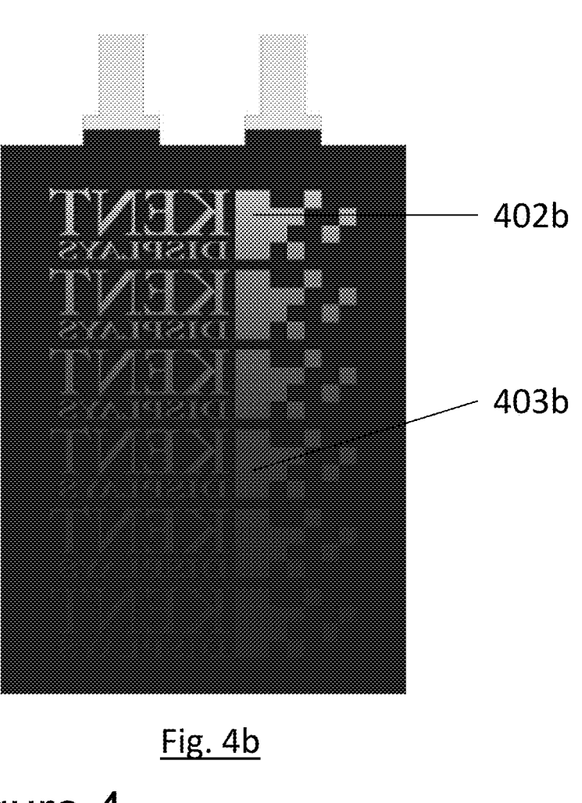
FIG. 4b shows a graphic design identifier.

FIG. 4 illustrates permanent identifier images on a writing tablet display with different levels of gray or visibility. Etched company logos are illustrated in FIG. 4b with the brightest image being image 402b and increasing levels of gray such as image 403b. Similarly, numeric identifiers or indicia are illustrated in FIG. 4a with the brightest image being image 402a and increasing levels of gray such as image 403a.

Figure 5:
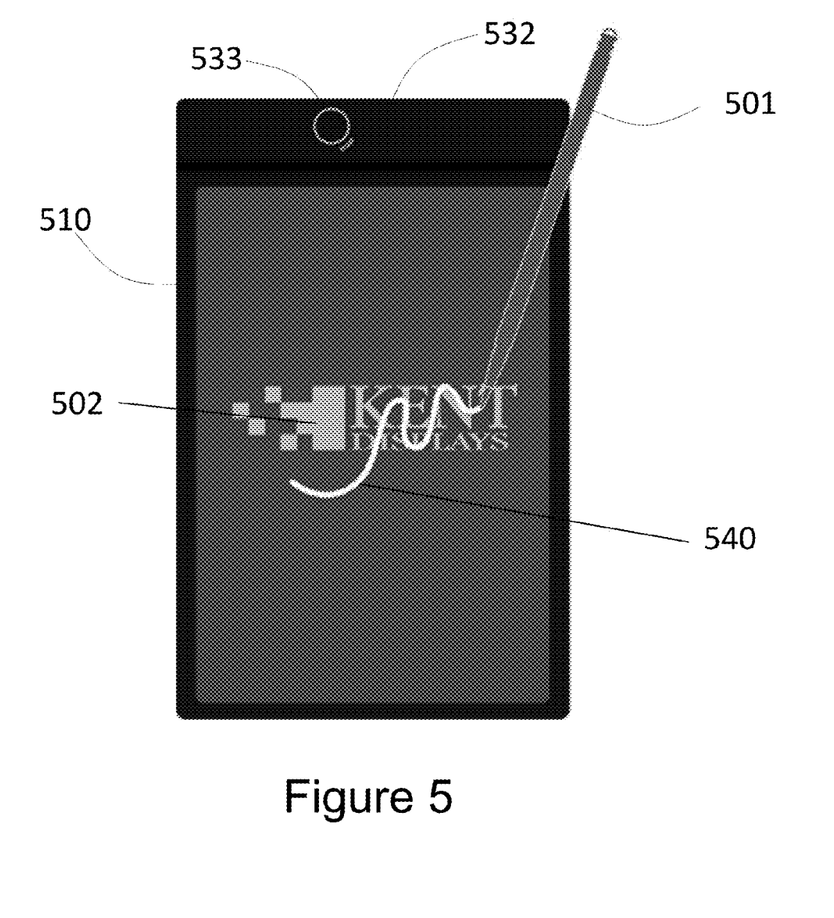
FIG. 5: Illustration of a Boogie Board eWriter with an ablated logo.

An illustration of the Boogie Board® product with an etched logo watermark 502 is illustrated in FIG. 5. The writing surface of the writing tablet display 510 with an erase switch 533 and housing 532 of the erase circuitry is shown in FIG. 5. This figure further illustrates the ability to write or scribe an electrically erasable, liquid crystal image 540 by changing the reflectivity of the liquid crystal by applying writing pressure with a stylus 501 on the writing tablet over the watermark 502. The tip of the stylus rests on an end of the line image 540 scribed by the stylus 501. Although not illustrated, this provides the ability to erase the liquid crystal image drawn with the stylus while not erasing the logo watermark.

Figure 6:
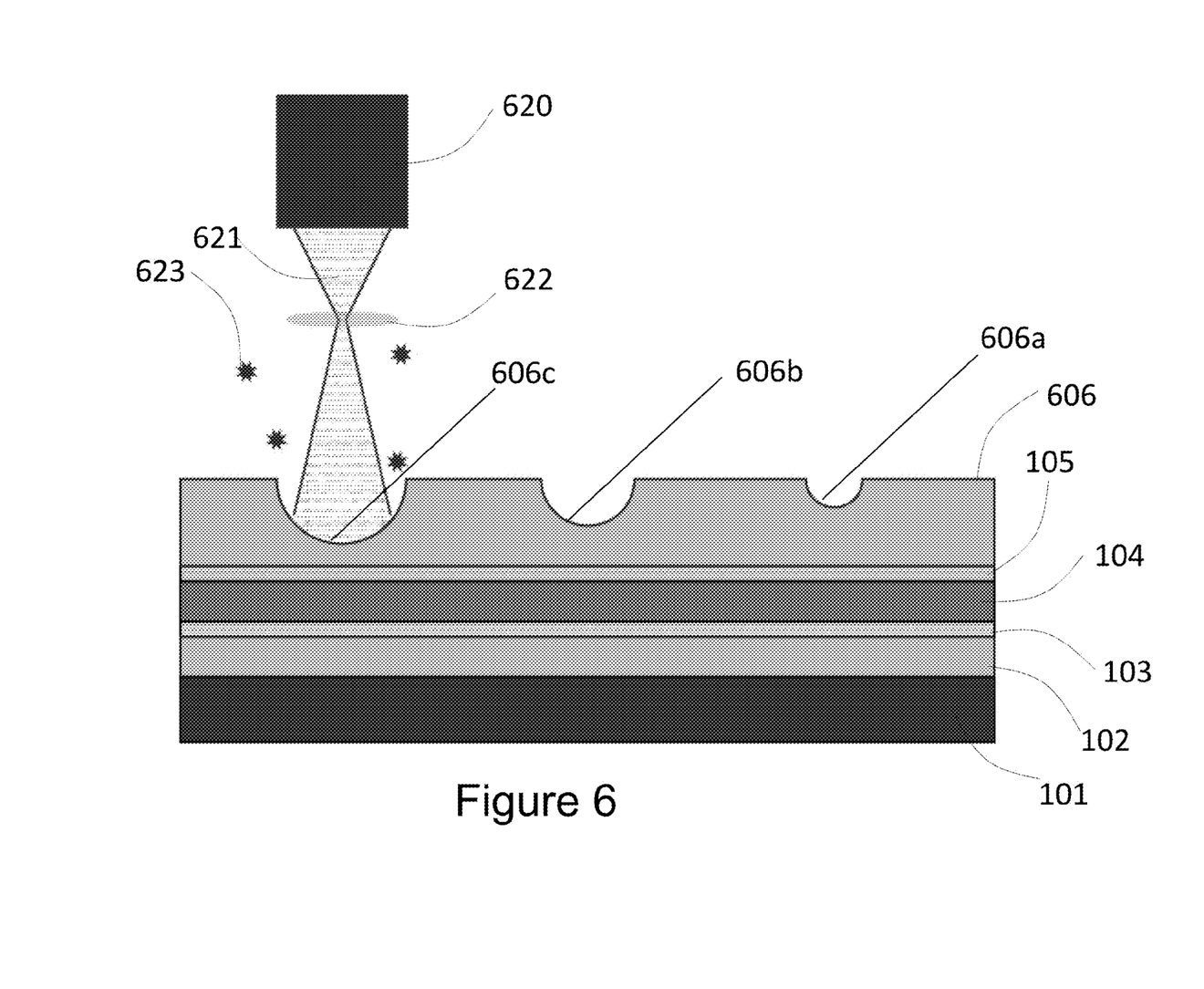
FIG. 6: Illustration of a laser ablation process of a display substrate.

In another embodiment, the identifier is made by etching (e.g., laser abating) the upper substrate as illustrated in FIG. 6 showing a writing tablet display with an etched upper substrate 606 but without the interconnecting tabs. In this illustration, laser 620 provides laser beam 621 which is focused by lens 622 on upper substrate 606 which is laminated to the other display components 105, 104, 103, 102 and 101 as described in FIG. 1. The ablating process illustrated in FIG. 6 shows the beam 621 of the laser 620 being focused onto substrate 606 by lens 622 with ablated particles 623 being scattered from the surface of the substrate 606. The amount the surface is etched depends upon the intensity of the laser beam 622 and the etching time. The etch time can be governed by a speed at with the laser traces the identifier image formed on the upper substrate. This embodiment does not provide a significant variation in the levels of gray in contrast to the previous embodiment where the back light absorbing layer is etched.

In other embodiments the laser may instead ablate and thereby etch a coating on the upper substrate such as a hard coat. Or it can similarly etch the coating and the underlying substrate.

To one skilled in the art it would be clear that the eWriter with laser-ablated patterns and the methods to create them disclosed herein can be accomplished with diverse back or front coats and laser types operating at different powers and speeds.

Figure 7:
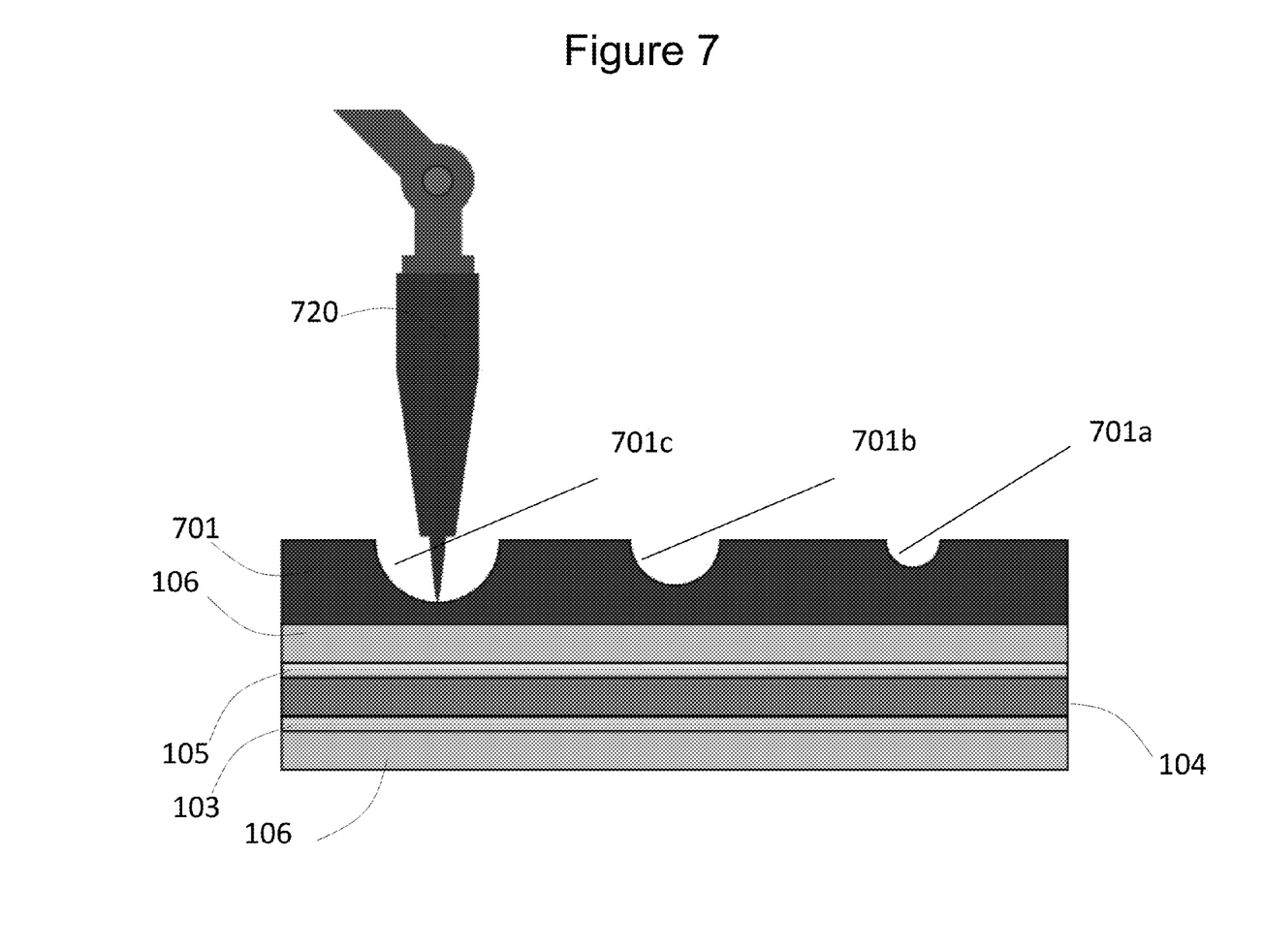
FIG. 7: Illustration of a mechanical etching process.

While laser etching is preferred, other methods can also be implemented to form the identifiers, such as mechanical etching or abrasion, waterjet, airjet, vibration, chemical etching, hot stamping, and combinations thereof. Mechanical etching is illustrated in FIG. 7 which shows the components of a writing tablet display, without the interconnecting ledges and turned upside down so that the back coat 701 is facing upward exposing it to the mechanically driven etching knife 720. The other components of the writing tablet 106, 105, 104, 103, and 106 are as described in FIG. 1. The etching process illustrated in FIG. 7 shows the mechanically driven knife 720 etching out selected regions of the back coat 701. The knife could, for example be robotically driven (robot not shown). Although the knife shown in the example depicted in FIG. 7 is intended for mechanical etching or abrasion, the identifier forming device could also function by vibration, waterjet, airjet and the like, for example. FIG. 7 shows examples of three levels of etching regions 701a, 701b and 701c. Each of these levels of etching creates a different level of gray on the background of the writing tablet display with deepest etched region 701c creating the brightest image while the shallowest etched region 701a creating the least bright image.

While the prior art of FIG. 1 illustrates a single layer of liquid crystal 104 there may be multiple layers of liquid crystals as described in U.S. Pat. Nos. 6,377,321, 6,654,080, 7,061,559 for the purpose of providing a multiple color display, which patents are incorporated herein by reference in their entireties. The liquid crystal layers in a multiple color display are in a stacked configuration and each liquid crystal layer is sandwiched between transparent conductors so that each layer may be separately switched electronically. Multiple layer displays, like the single layer display of FIG. 1, have a light absorbing back layer as well as an upper substrate. As such they can be etched to provide identifiers in the same manner as that described for a single layer display. Multiple layer displays with identifiers could be useful for such devices as electronic skins as (U.S. Pat. No. 8,310,630) or for a multiple color writing tablet (U.S. Pat. Nos. 8,229,301 and 8,139,039). Similarly, multiple color displays with identifiers could be used in multiple color or full color digital displays that are passively (U.S. Pat. No. 5,644,330) or actively (U.S. Pat. No. 7,317,437) driven electronically, which patents are incorporated herein by reference in their entireties.

EXAMPLE

A writing tablet display with gray level patterns suitable for identifiers was fabricated by etching the back opaque coating of a writing tablet display from a commercial Boogie Board® 8.5 writing tablet of Improv Electronics™ (a unit of Kent Displays, Inc.). The black ink coating on the back side of a Boogie Board® 8.5 writing tablet display was ablated as illustrated in FIG. 2 using a $CO_2$ laser (Coherent model GEM40 and Scanlab HurryScan scan head) at a power setting of approximately 8 Watts and marking speed of 19 mm/sec. The ink was etched with a graphic image which could be readily observed with reflected room light on the front of the writing tablet display. An electrically erasable line was traced on the display so as to change the reflectivity of the liquid crystal by applying pressure to the display using a pointed stylus over the graphic image with the traced line being clearly visible. The traced line could be electrically erased with the graphic image remaining on the display. We further observed we could change the level of gray by etching additional images with small adjustments in the power setting and in the marking speed of the laser. The traced images on the Boogie Board® display demonstrated the effectiveness of varying the gray level.

Many modifications and variations of the disclosed embodiments will be apparent to those of ordinary skill in the art in light of the foregoing disclosure. Therefore, it is to be understood that, within the scope of the appended claims, the invention can be practiced otherwise than has been specifically shown and described.

What is claimed is:

1. A liquid crystal display comprising:
   an upper substrate that is flexible and comprised of polymeric material;
   a liquid crystal layer disposed below said upper substrate and comprising cholesteric liquid crystal material dispersed in polymer that is adapted to allow localized flow of said liquid crystal material caused by writing pressure on said upper substrate that forms an image in a display area by changing reflectance of said cholesteric liquid crystal material where said writing pressure is applied, said liquid crystal layer including upper and lower sides extending parallel to said upper substrate;
   electrically conductive layers disposed adjacent to and parallel with said upper and lower sides of said liquid crystal layer;
   a lower transparent substrate disposed below said liquid crystal layer, wherein a lower one of the electrically conductive layers is disposed on an upper surface of said lower transparent substrate;
   a light absorbing back layer that absorbs light passing through said upper substrate and said liquid crystal layer, wherein said light absorbing back layer comprises a semitransparent ink disposed on said lower transparent substrate;
   electronic circuitry for applying a voltage to said electrically conductive layers that erases said image; and
   an identifier located on a component of said display in the display area, said component being selected from the group consisting of: said upper substrate, a layer disposed on or near said upper substrate, said light absorbing back layer and combinations thereof.

2. The liquid crystal display of claim 1 including electronic circuitry that is in electrical contact with said electrically conductive layers and applies a voltage that erases the image.

3. The liquid crystal display of claim 2 wherein said component is said light absorbing back layer that includes different depths of material removed to form said identifier so as to produce a gray scale image on said display that is not erased by said electronic circuitry.

4. The liquid crystal display of claim 3 wherein said light absorbing back layer has recessed lines, spots or regions formed therein that form said identifier, comprising a coating in said recessed lines, spots or regions of said light absorbing back layer.

5. The liquid crystal display of claim 4 wherein said coating is selected to reflect light of a predetermined color.

6. The liquid crystal display of claim 2 wherein said identifier is not coupled to said electronic circuitry.

7. The liquid crystal display of claim 1 wherein said component is said upper substrate that includes a portion of material removed to form said identifier.

8. The liquid crystal display of claim 1 comprising at least two stacked said liquid crystal layers each sandwiched between two electrically conductive layers, wherein each of said liquid crystal layers reflects light of a different color than the other said liquid crystal layers.

9. The liquid crystal display of claim 8 which is an electronic skin.

10. The liquid crystal display of claim 8 which is a passive or active matrix display including patterned said electrically conductive layers and electronic drive circuitry that is in electrical contact with said electrically conductive layers and applies a voltage that changes reflectivity of said liquid crystal material in said liquid crystal layers so as to form an image on said display and erases an image on said display.

11. The liquid crystal display of claim 1 which is a passive or active matrix display including patterned said electrically conductive layers and electronic drive circuitry that is in electrical contact with said electrically conductive layers and applies a voltage that changes reflectivity of said liquid crystal material so as to form an image on said display and erases an image on said display.

12. The liquid crystal display of claim 1 wherein said identifier is selected from the group consisting of: a watermark; a digital watermark; a graphic design; a bar code, an identification numeral, an identification code, a dot pattern and combinations thereof.

13. An electronic device including said liquid crystal display of claim 1, wherein said electronic device is selected from the group consisting of: a cell phone, a smart phone, a tablet, a laptop, a radio, a desktop monitor, an mp3player, an eReader, a toy, a television, motor vehicle instrument or accessory, electronic skin and combinations thereof.

14. A liquid crystal display comprising:
    a flexible transparent polymeric layer forming a writing surface;
    a liquid crystal layer comprising cholesteric liquid crystal material dispersed in polymer that is adapted to allow localized flow of said liquidcrystal material caused by writing pressure on said writing surface that forms an image in a display area by changing reflectance of said cholesteric liquid crystal material where said writing pressure is applied, said liquid crystal layer including upper and lower sides extending parallel to said writing surface;
    electrically conductive layers disposed adjacent to and parallel with said upper and lower sides of said liquid crystal layer;
    a lower substrate disposed below said liquid crystal layer and including a lower one of the electrically conductive layers disposed on an upper surface of said lower substrate;
    a light absorbing back layer that absorbs light passing through said writing surface and said liquid crystal layer, wherein said light absorbing back layer comprises an opaque ink or a semitransparent ink and is disposed below said lower substrate;

electronic circuitry for applying a voltage to said electrically conductive layers that erases said image; and an identifier disposed in the display area and below said liquid crystal layer, wherein said identifier is viewed through said flexible transparent polymer layer in the display area.

15. The liquid crystal display of claim 14 wherein said identifier comprises recessed lines, spots or regions.

16. The liquid crystal display of claim 14 wherein said identifier is selected from the group consisting of: a watermark; a digital watermark; a graphic design; a bar code, an identification numeral, an identification code, a dot pattern and combinations thereof.

17. A liquid crystal display comprising: an upper substrate that is transparent; a liquid crystal layer including liquid crystal material disposed near said upper substrate, said liquid crystal layer including upper and lower sides extending parallel to said upper substrate; electrically conductive layers disposed adjacent to and parallel with said upper and lower sides of said liquid crystal layer; a light absorbing back layer positioned so as to absorb light passing through said upper substrate and said liquid crystal layer, said light absorbing back layer being located under said liquid crystal layer and under a lower one of said electrically conductive layers; wherein an image is formed in a display area by changing a reflective state of the liquid crystal material that contrasts with said light absorbing back layer and said image can be erased; an identifier located on a component of said display in the display area; wherein said identifier is viewed on said liquid crystal display in the display area when the image is formed and after the image is erased; electronic circuitry that is in electrical contact with said electrically conductive layers and applies a voltage that erases the image; wherein said component is said light absorbing back layer that includes different depths of material removed to form said identifier so as to produce a gray scale image on said display that is not erased by said electronic circuitry; wherein said light absorbing back layer has recessed lines, spots or regions formed therein that form said identifier, comprising a coating in said recessed lines, spots or regions of said light absorbing back layer; and wherein said coating reflects infrared light with a different reflectivity than the light absorbing back layer and enables said identifier to be hidden except when viewed in infrared light.

18. A liquid crystal display comprising: an upper substrate that is transparent; a liquid crystal layer including liquid crystal material disposed near said upper substrate, said liquid crystal layer including upper and lower sides extending parallel to said upper substrate; electrically conductive layers disposed adjacent to and parallel with said upper and lower sides of said liquid crystal layer; a light absorbing back layer positioned so as to absorb light passing through said upper substrate and said liquid crystal layer, said light absorbing back layer being located under said liquid crystal layer and under a lower one of said electrically conductive layers; wherein an image is formed in a display area by changing a reflective state of the liquid crystalmaterial that contrasts with said light absorbing back layer and said image can be erased; an identifier located on a component of said display in the display area; wherein said identifier is viewed on said liquid crystal display in the display area when the image is formed and after the image is erased; electronic circuitry that is in electrical contact with said electrically conductive layers and applies a voltage that erases the image; wherein said component is said light absorbing back layer that includes different depths of material removed to form said identifier so as to produce a gray scale image on said display that is not erased by said electronic circuitry; wherein said light absorbing back layer has recessed lines, spots or regions formed therein that form said identifier, comprising a coating in said recessed lines, spots or regions of said light absorbing back layer; and wherein said coating fluoresces visible light when activated by ultraviolet light and enables said identifier to be hidden except when ultraviolet light is applied to said coating.

\* \* \* \* \*